United States Patent [19]

Miller, Jr.

[11] Patent Number: 5,057,701

[45] Date of Patent: Oct. 15, 1991

[54] HIGH SPEED LOW SKEW CLOCK CIRCUIT

[75] Inventor: Robert H. Miller, Jr., Loveland, Colo.

[73] Assignee: Hewlett-Packard Company, Palo Alto, Calif.

[21] Appl. No.: 479,562

[22] Filed: Feb. 13, 1990

[51] Int. Cl.⁵ .................. H03K 5/00; H03K 3/29; H03K 5/13; H03K 7/00

[52] U.S. Cl. .................. 307/262; 307/269; 307/272.1; 307/605; 307/291; 307/480; 328/63

[58] Field of Search .............. 307/262, 272.1, 451, 307/585, 594, 242, 269, 480, 605, 608, 291; 328/63

[56] References Cited

U.S. PATENT DOCUMENTS 4,417,158 11/1983 Ito et al. .................. 307/262
4,837,505 6/1989 Mitsunobu .................. 307/242

Primary Examiner—Stanley D. Miller
Assistant Examiner—Trong Phan
Attorney, Agent, or Firm—Edward L. Miller

[57] ABSTRACT

A clock buffer circuit achieves insensitivity to the particular voltage levels and drift therein of input signals used to generate the clock, by use of a differential common gate amplifier incorporating an internally generated threshold voltage. Four separate gain paths couple the differential common gate amplifier to an output stage. Two of the gain paths are used to propagate edges that cause respective abrupt transitions in each direction for a first of two complementary clock signals. The other two accomplish the same for the other complementary clock signal. Each gain path is optimized to propagate a leading edge of a particular direction (relative to its point of origin, the direction of the edge inverts as it goes from stage to stage). Of these four gain paths, a first pair are used to create a high level of drive for the low to high transitions in the clock signal and its complement. Because of the optimization, this drive cannot be removed as abruptly as it can be applied. A latch-like circuit in the gain paths cause early removal of the high level, or hard, drive, leaving in place a maintenance, or holding, level of drive. Each holding drive is abruptly removed by an associated gain path in the remaining pair of gain paths. The hard drive is left in place only long enough to ensure that the capacitance of the clock line is adequately charged. An anti-glitch mechanism bullet proofs the entire circuit against drive fights caused by ambiguities arising from slow transitions that might arise from the differential common gate amplifier.

3 Claims, 5 Drawing Sheets

HIGH SPEED LOW SKEW CLOCK CIRCUIT

BACKGROUND AND SUMMARY OF THE INVENTION

A clock circuit for use in high speed microprocessor and other logic circuits should have fast transitions that occur in a known and reliable relation to each other (such reliability may be termed "low skew"). These desirable properties of high speed and low skew each requires the minimization of internal propagation delay within the clock circuit. In addition, if the actual clock buffer circuitry is driven from an external signal, it would be desirable if the receiver circuitry were as insensitive as possible to the actual levels of the external signal, as well tolerant of drift in those levels.

These goals are met in the clock circuit described herein by employing a differential receiver in CMOS that is of the "common gate" configuration and that is assisted by an internally developed threshold voltage. The two sides of the differential receiver each produces a respective fast high-to-low transition that is then sent via an associated pair of gain paths to the actual output stage. One such pair of gain paths is associated with each side of, or output from, the differential receiver, for a total of four paths in all. As a consequence, each path needs only exhibit excellent propagation for a leading edge transitioning in a particular direction at the input of the path, allowing optimization (transistor sizing) to favor that particular leading edge. This allows each gain path to achieve approximately half the propagation delay that a corresponding buffer would exhibit if it had to be responsible for active edges in both directions. The four gain paths are combined with a latch-like circuit that creates "hard" (i.e., powerful) drive of complementary output clock lines only during the initial period of time when the capacitance of those clock lines needs to be charged. Afterwards, the level of drive is reduced to a holding, or maintenance, level. This can be done, for example, by sensing that the clock line of interest has reached its high state, and then turning off the large transistor doing the hard driving. Another way to do it is to sense that the complementary clock signal has reached its low state. In either scheme, the fact that the complementary clock line is now low is used as part of a cross coupled output latch that keeps a smaller sustaining driver transistor turned on.

By using such a two-level drive a small signal can be used to abruptly terminate the holding drive, while at the same time the hard drive for the other state of the clock commences. That is, there are low propagation time gain paths for turning hard drives on, and for terminating the holding drive (which are the four set out above), but not a separate one for killing the hard drive. Instead, hard drive removal uses the associated gain path to propagate an active edge whose direction of transition is opposite of what that gain path is optimized for. That hurts nothing, however, since the hard drive need only be removed before the next transition in the clock (a little less than a half-cycle hence), which is long compared to the propagation times, whether optimal or not. Thus, this scheme avoids the need for a abrupt termination of the hard drive, by letting it go away at a slower rate as soon as it is not needed. This preserves overall minimum propagation time for the control of each transition in the clock, thus producing a high speed low skew clock.

DESCRIPTION OF A PREFERRED EMBODIMENT

Figure 1:
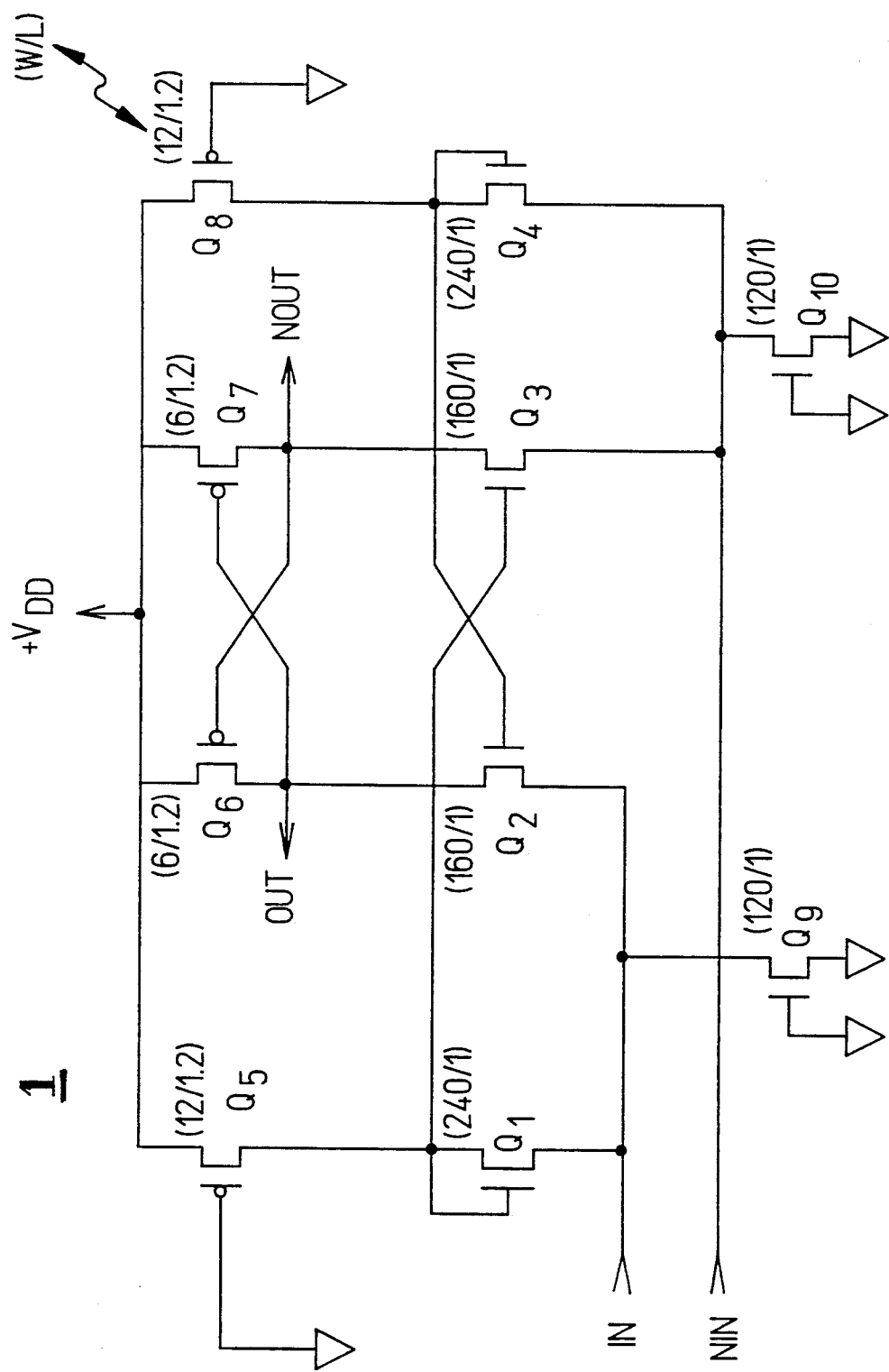
FIG. 1 is schematic representation of a CMOS differential receiver for clock signals that is constructed in accordance with the principles of the invention.

Refer now to FIG. 1, wherein is shown a schematic representation of a CMOS differential receiver circuit 1 suitable for being driven from a wide variety of sources, such as the ECL and TTL families of logic. The circuit 1 shown in FIG. 1 may be termed a "common gate" differential amplifier that achieves low propagation delay on the high to low transitions of the output signals OUT and NOUT. In this and the other figures, transistors such as $Q_5$ that have small circles on their gates are P-channel devices, while those such as $Q_1$ are N-channel devices. It will be understood by those skilled in the art that the embodiment shown is not restricted in its teachings to only the polarities of the devices shown, and that if the polarity of each of the FET's is changed, +VDD made ground and ground made −VDD, then a circuit is obtained that has its input voltage referenced to and near the positive side of the supply voltage. Also, note that the numbers in parentheses (W/L) by each transistor denote its width W and length L, each in microns.

The operation of the differential receiver 1 of FIG. 1 is described in detail in the paragraphs that follow. Applied to input terminals IN and NIN are an input signal and its complement. These input signals might be intended for use as a clock, a strobe, or perhaps for some other use. The actual levels of the input signals need not be known in advance, and these levels may experience a reasonable drift without disturbing the successful operation of the differential receiver circuit 1.

Furthermore, the circuit of FIG. 1 may be implemented without any hysteresis, with hysteresis, or with what may be termed "negative hysteresis", where the circuit anticipates changes in the input signals.

The Transistors $Q_9$ and $Q_{10}$ are input protection devices for protection from ESD (electro-static discharge).

Transistor pairs $Q_1/Q_5$ and $Q_4/Q_8$ form bias circuits producing a bias equal to a single threshold voltage $V_t$. Transistors $Q_5$ and $Q_8$ act as load resistances for $Q_1$ and $Q_4$, respectively. These bias voltages cause the gate of $Q_3$ to equal $V_t$ plus the voltage $V_{IN}$ applied to IN, and the gate of $Q_2$ to equal $V_t$ plus the voltage applied at NIN. If the input voltage applied to IN is less than that applied to NIN ($V_{NIN}$), then the voltage $V_{OUT}$ at OUT will fall rapidly, since the gate voltage of $Q_2$ will be more than one $V_t$ higher than $V_{IN}$. At the same time $Q_7$ pulls $V_{NOUT}$ high, since the gate voltage of $Q_3$ diminished by $V_{NIN}$ is less than $V_t$.

To achieve hysteresis, the ratio of the widths of $Q_6$ to $Q_2$ is made larger than the ratio of the widths of $Q_5$ to $Q_1$. By symmetry, a similar larger ratio favors the ratio of $Q_7$ to $Q_3$ over the ratio of $Q_8$ to $Q_4$. For negative hysteresis, the relationship "less than" is substituted for "larger than" in the above. For no hysteresis, "equal to" is substituted for "larger than".

The cross coupling of $Q_6$ and $Q_7$ reduces the DC load on the input signals IN and NIN. This arises since, for each of the transistor pairs $Q_6/Q_2$ and $Q_7/Q_3$, one member of each pair is off whenever the other member of that pair is on. In this connection, it can be observed that the differential receiver circuit 1 of FIG. 1 achieves high voltage gain (CMOS output swings for only one $V_t$ swing on the input) without incorporating any appreciable current gain.

Figure 2A:
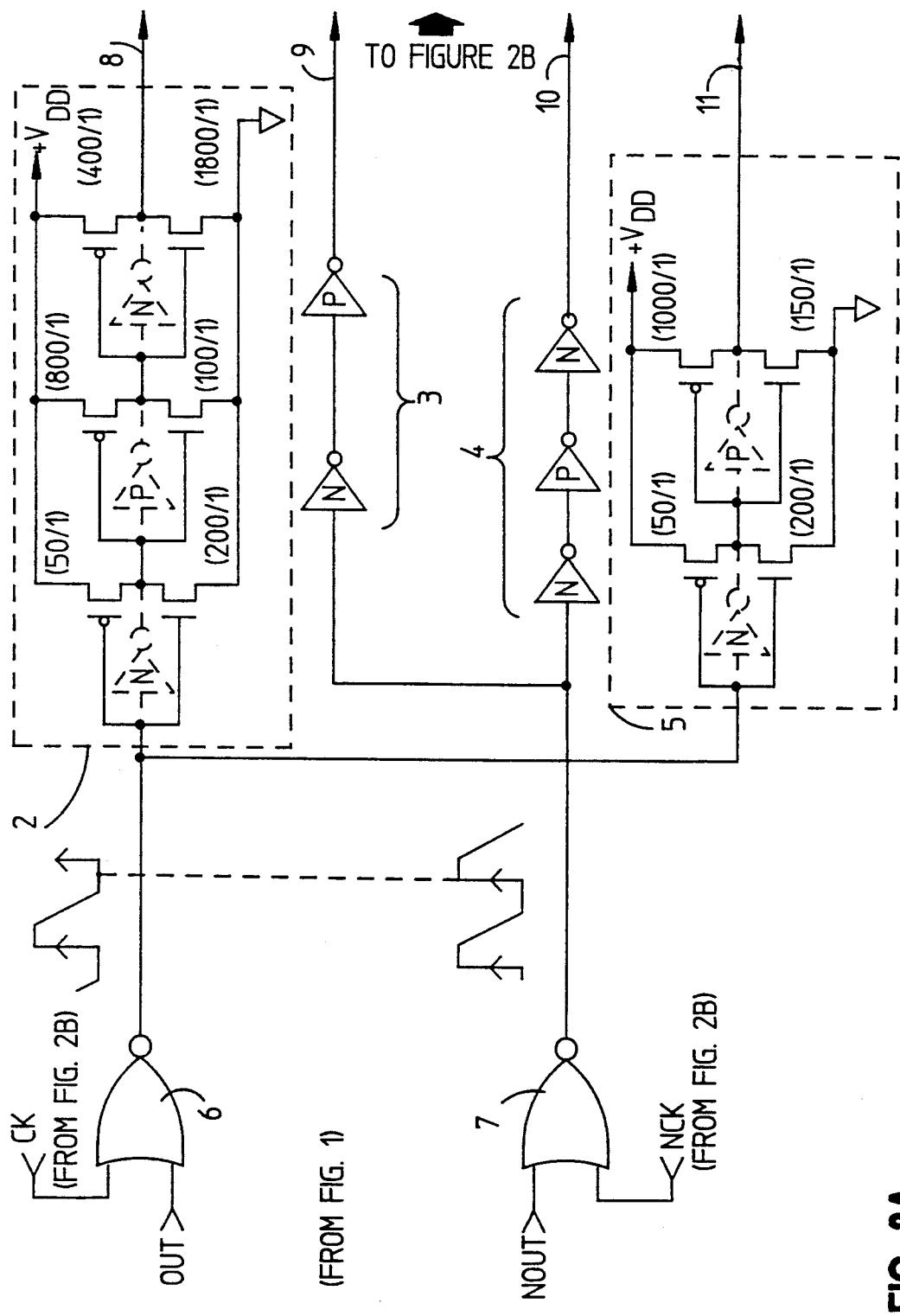
FIGS. 2A-B are schematic representations of an asymmetric gain buffer and two-level drive output stage constructed in accordance with the principles of the invention.

As shown in FIG. 2A, the outputs OUT and NOUT of FIG. 1 are coupled through asymmetric buffers to form separate pull-up and pull-down signal paths. These separate paths are the cascaded series of buffers denoted by reference numerals 2 through 5. Separate pull-up and pull-down paths 2 and 3 are part of a latch-like circuit for generation of the signal CK (Clock) from the signals OUT and NOUT. Similarly, separate pull-up and pull-down paths 4 and 5 are part of a latch-like circuit for generation of the signal NCK from the signals OUT and NOUT. These latch-like circuits involve NOR gates 6 and 7 and the signals CK and NCK, which are generated by circuitry depicted in FIG. 2B.

Consider path 3. It consists of two cascaded buffers, of which the first is labeled as "N" and the second as "P". This notation means that in the first buffer the N-channel device is large, while its associated P-channel device is small. In the second buffer the P-channel device is large, while its associated N-channel device is small. This particular arrangement propagates a rising edge (at the input of the cascaded series) faster than a falling one. It also propagates an input rising edge approximately twice as fast as does a cascaded series of buffers required to minimize propagation delay for both rising and falling edges at the input to the cascaded series.

Path 2 is similar to path 3, except that it contains an extra stage, so that for an abrupt low to high transition at the input of either path, path 2 produces a corresponding abrupt high to low transition, whereas path 3 would produce an abrupt low to high transition. Note also that within the dotted line denoted by reference numeral 2 is a schematic expansion defining exactly what is meant by this business of "labeled as N" and "labeled as P". The general idea here is this: by arranging that a cascaded series of buffers need only quickly propagate one active edge of an applied signal (leaving the meaning associated with the other would-be active edge to the buffers in a separate path) the FET's in each buffer of the path may be advantageously ratioed in favor of the N-channel or P-channel device whose purpose is to drive the active edge. Which devices these are indicated by the N's and P's in FIG. 2A that label the stages of the separate paths 2 through 5. This ratioing is simply the selection of the size of the designated transistor, and is a well known action based, in part, upon the square root of the mobility ratio for the N and P channel materials used in the transistors.

The idea behind the overall arrangement of FIG. 2A is that each of NOR gates 6 and 7 will produce abrupt low to high transitions, but in alternation and occurring at different points in time; that is, the output from the NOR gates 6 and 7 are non-overlapping signals. The abrupt low to high transitions from NOR gate 6 produce, with minimum delay (and hence with maximum clock rate and minimum propagation delay), an abrupt high to low transition at the output 8 of path 2 and an abrupt low to high transition at the output 9 of path 3. In like fashion, the abrupt low to high transition from NOR gate 7 produces with a minimum of delay an abrupt high to low transition at the output 10 of path 4 and an abrupt low to high transition at the output 11 of path 5. It should be remembered that the low to high transitions for paths 2 and 3 originate from the separate NOR gates and occur in interleaving alternation. Hence, line 8 experiences an abrupt falling edge in interleaving alternation with line 9 experiencing an abrupt rising edge. Similar remarks apply to the outputs on lines 10 and 11. Note that because they originate at the same NOR gate, the abrupt falling edge on line 8 occurs simultaneously (within propagation delay differences that are very small indeed) with the abrupt rising edge on line 11. A similar simultaneity obtains for the transitions on lines 9 and 10.

Figure 2B:
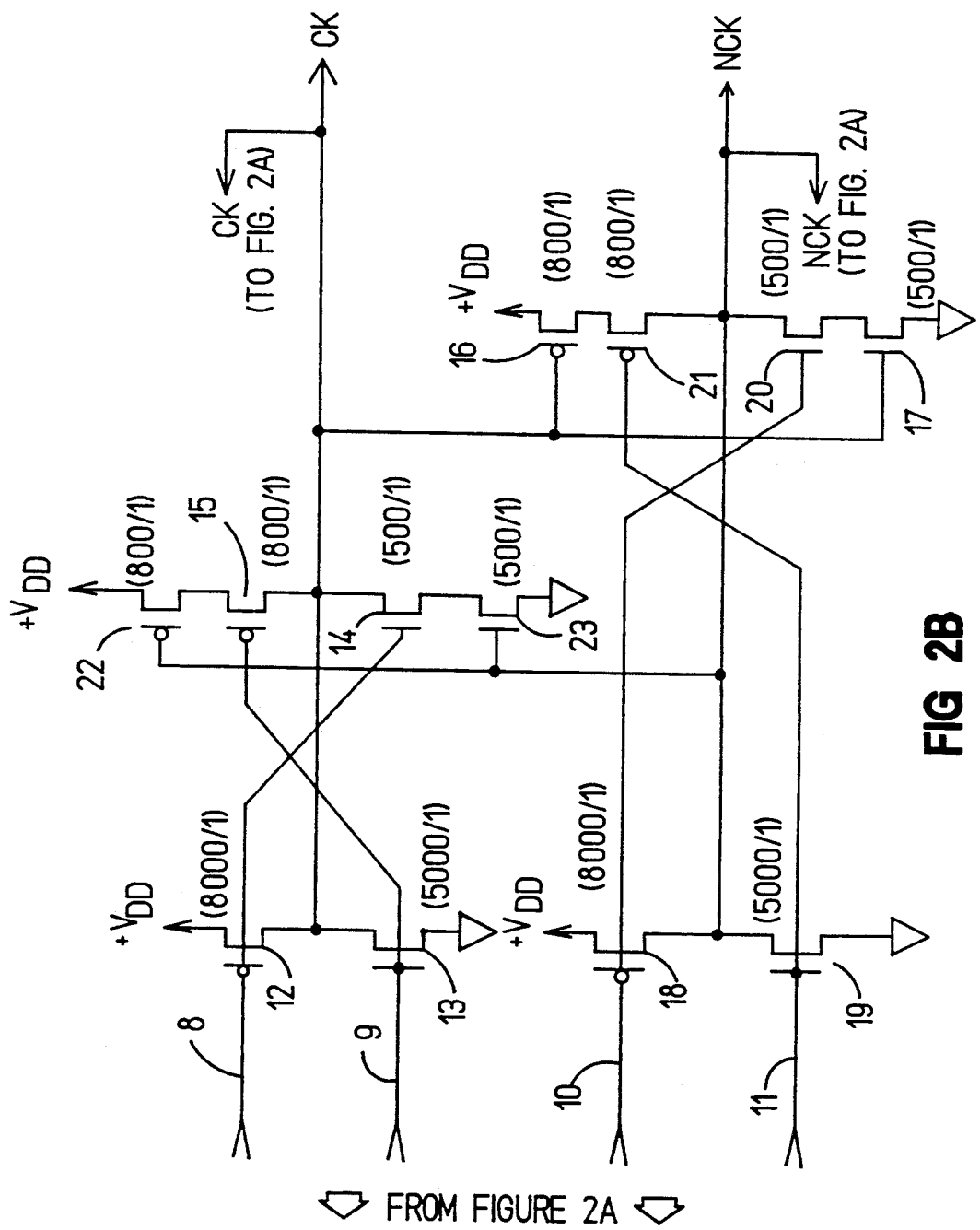

Turning now to FIG. 2B, here is what use is made of the various active edges described in connection with FIG. 2A. When line 8 experiences an abrupt falling edge, it causes transistor 12 to turn on abruptly and transistor 14 to turn off abruptly. Transistor 12 is the primary current path for rapidly pulling CK high. (In the two level drive scheme, it is the "hard" driver for CK.) At the same time, an abrupt rising transition on line 11 turns on transistor 19, pulling NCK low, which in turn shuts off transistor 23 and turns on transistor 22. Line 9 has meanwhile been low, keeping transistor 13 off (making it safe for transistor 12 to turn on) and keeping transistor 15 on. Thus, turning transistor 22 on will also contribute current toward the charging of the line capacitance of the CK line, although the primary purpose of the path through transistors 22 and 15 is to maintain CK high once the line capacitance of the CK line is charged and transistor 12 is turned off in anticipation of the next transition in the input signal.

As described above, NCK goes low as CK goes high. This is because lines 8 and 11 originate from a common transition, but experience different numbers of inversion. Thus, when line 8 experiences an abrupt falling edge, line 11 experiences an abrupt rising edge. That, in turn, turns on transistor 19 and causes NCK to go low. That, in turn, is what causes transistor 22 to turn on as mentioned above.

By symmetry, a similar set of actions obtains as line 10 experiences an abrupt falling edge and line 9 experiences an abrupt rising edge, only now transistor 18 serves as a primary current path for hard drive for the NCK line. Transistors 16 and 21 maintain the level on NCK after transistor 18 shuts off, again in anticipation of the next transition in the input signal.

We turn now to how the transition from hard drive to a maintenance, or holding drive, is accomplished. Consider the low to high transition for the line CK. Notice how the signal CK is fed back to the NOR gate 6 in FIG. 2A. It will be recalled that it was an abrupt falling edge on line 8 that pulled CK high. That abrupt falling edge was in turn caused by an abrupt rising edge at the output of NOR gate 6. That, in turn, was caused by OUT going low while CK was already low. That output of NOR gate 6 will remain high only as long as both OUT and CK are low. But CK gets pulled high, and very abruptly, too, as we have seen. When CK gets high the output of NOR gate 6 goes low. This high to low transition propagates more slowly through paths 2 and 5 than does its low to high counterpart discussed earlier. Eventually, line 8 experiences a rising edge, and line 11 a falling edge. The rising edge on line 8 shuts off transistor 12, removing the hard drive for CK. The holding drive of transistors 15 and 22 remains on, however. This is, in part, because NCK is still low (keeping transistor 22 on) and in part because line 9 is low. Line 9 is low because NOUT is high (we started with OUT going low, remember), which forces the output of NOR gate 7 to be low, which through path 3 forces line 9 low also. This holding drive stays in effect until OUT and NOUT transition to their opposite states, whereupon a symmetry argument involving the arrival of NCK at NOR gate 7 explains how the hard drive of NCK from transistor 18 is removed and holding drive from transistors 16 and 21 sustains NCK.

The arrangement described above will work as described provided that certain constraints are placed upon the transitions of OUT and NOUT. In particular, if CK falls before OUT rises sufficiently, the output of NOR gate 6 may glitch high and cause a drive fight. A similar possibility exists that the output of NOR gate 7 may glitch high if NCK falls before NOUT rises sufficiently. One solution is to control the associated transitions on OUT and NOUT. Another solution is to replace the NOR gates 6 and 7 with the circuitry shown in FIGS. 3A and 3B. What that circuitry does is to add some sequencing logic ahead of the NOR gate.

Figure 3A:
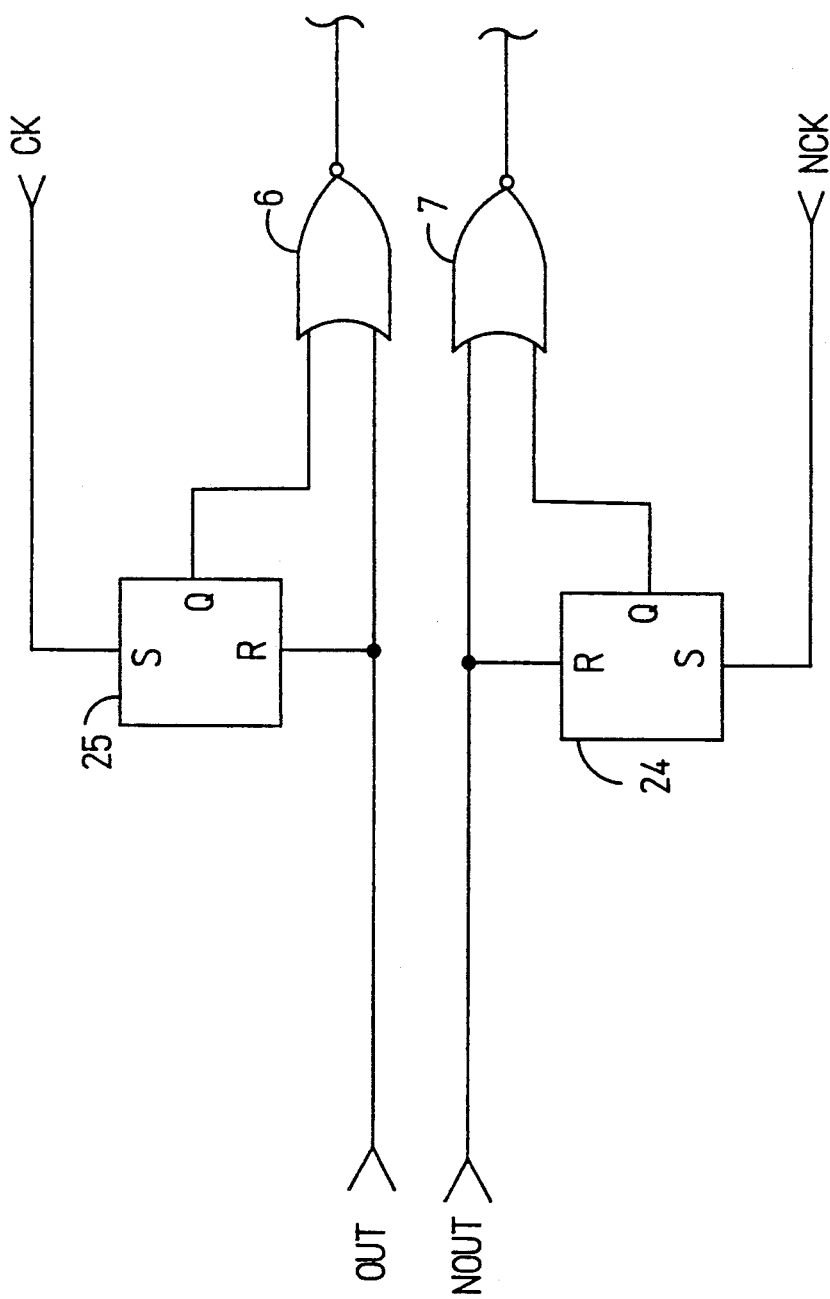
FIGS. 3A-B describe an anti-glitch circuit that may be substituted into the circuit of FIGS. 2A-B.
Figure 3B:
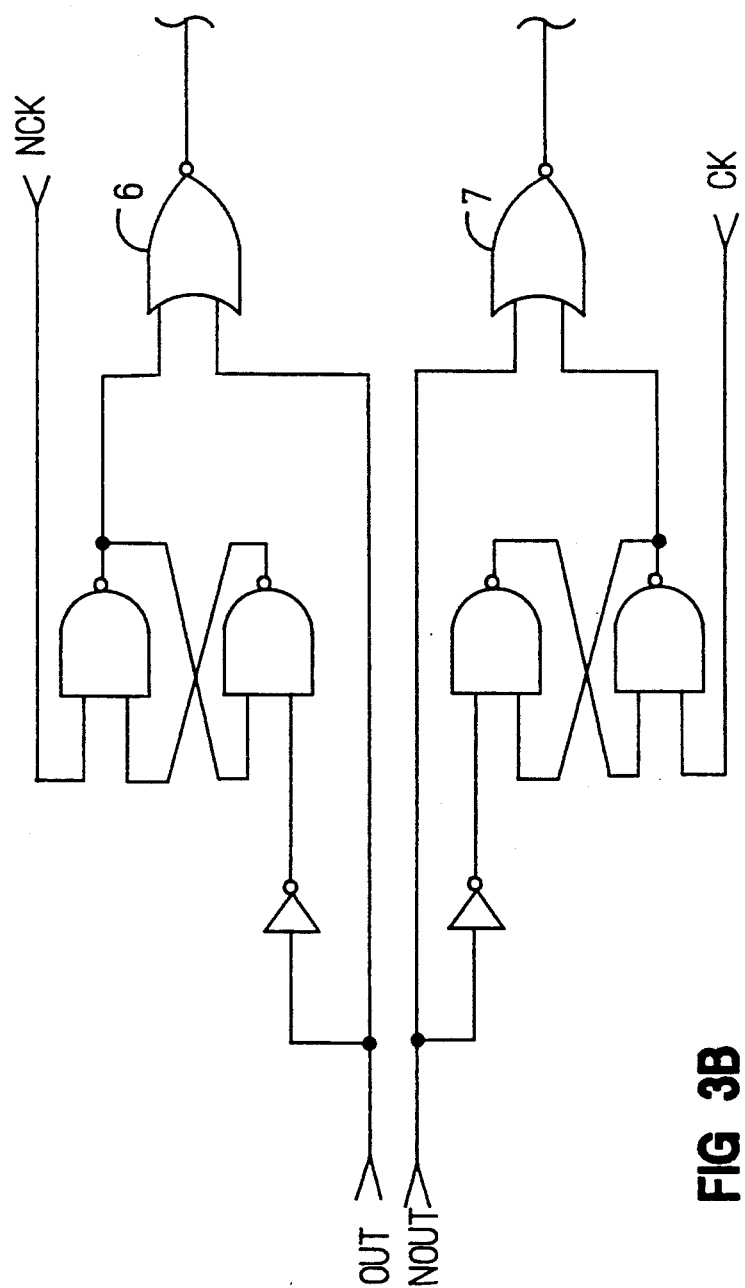

FIG. 3B illustrates at the gate level what circuitry may be used, while FIG. 3A illustrates the functional equivalent of FIG. 3B. Consider the case for NOR gate 6, as shown in FIG. 3A. A moments reflection will confirm that the anti-glitching circuit operates by using the rising edge of OUT subsequent to CK's going low to force the output of NOR gate 6 low. That is, the Q output of S/R flip-flop 25 substitutes the rising edge of OUT for the falling edge of CK. S/R flip-flop 24 performs a similar function for NOR gate 7 and the signals NOUT and NCK.

FIG. 3B shows a gate level embodiment that has the same overall functionality as FIG. 3A. Note however, that CK and NCK have been interchanged to avoid the use of extra inverters ahead of their inputs to the cross coupled gates that function as the flip-flops. A further difference between the circuits of FIGS. 3A-B concerns how the hard drive is removed. In FIG. 3A the rising edge of clock removes the hard drive, as discussed in connection with FIGS. 2A-B. In the case of FIG. 3B, the falling on NCK is used to terminate the hard drive of CK.

I claim:

1. A circuit for generating complementary signals, comprising:
    first and second output terminals (CK, NCK);
    first switching means (12), coupled to the first output terminal, for pulling the first output terminal high in response to a first drive signal (8) having a logic level of true;
    second switching means (13), coupled to the first output terminal, for pulling the first output terminal low in response to a second drive signal (9) having a logic level of true;
    third switching means (18), coupled to the second output terminal, for pulling the second output terminal high in response to a third drive signal (10) having a logic level of true;
    fourth switching means (19), coupled to the second output terminal, for pulling the second output terminal low in response to a fourth drive signal (11) having a logic level of true;
    first holding means (15, 22), coupled to the first and second output terminals and to the second drive signal, for holding the first output terminals high whenever the second output terminal is low and the second drive signal is false;
    second holding means (16, 21), coupled to the first and second output terminals and to the fourth drive signal, for holding the second output terminal high whenever the first output terminal is low and the fourth drive signal is false;
    first logic means (6/6, 25), coupled to an input signal and to the first output terminal, for producing first and fourth drive signals each having false to true transitions upon a false to true transition of the input signal while the first output terminal is low, and each also having true to false transitions upon a low to high transition of the first output terminal; and
    second logic means (7/7, 24), coupled to the input signal and to the second output terminal, for producing second and third drive signals each having false to true transitions upon a true to false transition of the input signal while the second output terminal is low, and each also having true to false transitions upon a low to high transition of the second output terminal.

2. A method of minimizing the propagation delay of the false to true and true to false transitions of an input logic signal through a buffer, the method comprising the steps of:
    a. producing a false to true transition in a first drive signal in response to a false to true transition of the input signal;
    b. propagating the false to true transition in the first drive signal through a first gain path optimized to minimize the propagation delay of false to true transitions;
    c. connecting, in response to the arrival of the false to true transition at the output of the first gain path, an output terminal to a reference signal whose value is true;
    d. detecting that the output terminal has attained a value of true;
    e. disconnecting, in response to the detection in step (d), the output terminal from the reference terminal whose value is true;
    f. producing a false to true transition in a second drive signal in response to a true to false transition of the input signal;
    g. propagating the false to true transition in the second drive signal through a second gain path optimized to minimize the propagation delay of false to true transitions;
    h. connecting, in response to the arrival of the false to true transition at the output of the second gain path, the output terminal to a reference signal whose value is false;
    i. detecting that the output terminal has attained a value of false; and
    j. disconnecting, in response to the detection in step (i), the output terminal from the reference terminal whose value is false.

3. A method of minimizing the propagation delay of the false to true and true to false transitions of an input logic signal through a buffer, the method comprising the steps of:

a. producing a false to true transition in a first drive signal in response to a false to true transition of the input signal;
b. propagating the false to true transition in the first drive signal through a first gain path optimized to minimize the propagation delay of false to true transitions;
c. connecting, in response to the arrival of the false to true transition at the output of the first gain path, an output terminal to a reference signal whose value is true;
d. detecting that the output terminal has attained a value of true;
e. producing a true to false transition in the first drive signal in response to the detection in step (d);
f. disconnecting, in response to the true to false transition of the first drive signal, the output terminal from the reference terminal whose value is true;
g. producing a false to true transition in a second drive signal in response to a true to false transition of the input signal;
h. propagating the false to true transition in the second drive signal through a second gain path optimized to minimize the propagation delay of false to true transitions;
i. connecting, in response to the arrival of the false to true transition at the output of the second gain path, the output terminal to a reference signal whose value is false;
j. detecting that the output terminal has attained a value of false;
k. producing a true to false transition in the second drive signal in response to the detection in step (j); and
l. disconnecting, in response to the true to false transition of the second drive signal, the output terminal from the reference terminal whose value is false.

* * * * *